United States Patent [19]
Dennison et al.

[11] Patent Number: 5,780,326
[45] Date of Patent: Jul. 14, 1998

[54] FULLY PLANARIZED THIN FILM TRANSISTOR (TFT) AND PROCESS TO FABRICATE SAME

[75] Inventors: Charles H. Dennison, Boise; Monte Manning, Kuna, both of Id.

[73] Assignee: Micron Technology, Inc., Boise, Id.

[21] Appl. No.: 711,923

[22] Filed: Sep. 11, 1996

Related U.S. Application Data

[62] Division of Ser. No. 621,766, Mar. 22, 1996, Pat. No. 5,616,934, which is a continuation of Ser. No. 304,910, Sep. 12, 1994, abandoned, which is a division of Ser. No. 61,402, May 12, 1993, abandoned.

[51] Int. Cl.⁶ ............... H01L 21/00; H01L 21/20
[52] U.S. Cl. ............. 438/152; 438/398; 438/964
[58] Field of Search ............... 437/41, 52, 187, 437/190, 228; 438/152, 398, 964

[56] References Cited

U.S. PATENT DOCUMENTS

| | | | |
|---|---|---|---|
| 4,740,483 | 4/1988 | Tobin | 437/187 |
| 4,884,123 | 11/1989 | Dixit et al. | 437/190 |
| 5,077,238 | 12/1991 | Fujii et al. | 437/228 |
| 5,112,765 | 5/1992 | Cederbaum et al. | 437/41 |
| 5,266,507 | 11/1993 | Wu | 257/66 |
| 5,334,862 | 8/1994 | Manning et al. | 257/347 |
| 5,336,917 | 8/1994 | Kohyama | 257/347 |
| 5,340,763 | 8/1994 | Dennison | 437/52 |
| 5,340,765 | 8/1994 | Dennison et al. | 437/52 |

OTHER PUBLICATIONS

Wolf et al., Silicon Processing For the VLSI Era: Vol. 1: Process Technology, Lattice Press, pp. 189–191, Month Unknown 1986.

Primary Examiner—John Niebling
Assistant Examiner—Michael S. Lebentritt

[57] ABSTRACT

The invention is directed to a thin film transistor (TFT) fabricated by using a planarized poly plug as the bottom gate for use in any integrated circuit and in particular a static random access memory (SRAM). The TFT is used in an SRAM device to form a planarized SRAM cell comprising: a pulldown transistor having a control gate and source/drain terminals; a planarized insulating layer having grooves therein, each groove providing access to an underlying conductive material; a planarized conductive plug residing inside each groove, whereby a first conductive plug forms a thin film transistor gate connecting to an to an adjacent inverter and a second conductive plug provides connection to the gate of the pulldown device; a gate dielectric overlying the first planarized conductive plug; and a patterned semiconductive layer doped such that a channel region aligns to each thin film transistor gate and a source/drain region aligns to each side of the channel region is formed.

21 Claims, 6 Drawing Sheets

FULLY PLANARIZED THIN FILM TRANSISTOR (TFT) AND PROCESS TO FABRICATE SAME

This is a divisional to U.S. patent application No. 08/621,766, filed Mar. 22, 1996, now U.S. Pat. No. 5,616,934, which is a continuation to U.S. patent application No. 08/304,910, filed Sept. 12, 1994, now abandoned, which is a divisional to U.S. patent application No. 08/061,402, filed May 12, 1993, now abandoned.

FIELD OF THE INVENTION

This invention relates to semiconductor devices and more particularly to a thin film transistor structure and a process to create same. The thin film transistor structure can be used as an active load in integrated circuit devices, such as Static Random Access Memories (SRAMs).

BACKGROUND OF THE INVENTION

One of the common elements required in electrical circuit devices is the simple pullup (or pulldown device) from an active device to one of the power supply buses. The pullup is simple if used to construct a circuit using discrete components, in that, all that is required is selecting a resistor of the desired resistance and tolerance, connecting it between an active device, such as an open collector transistor, and $V_{cc}$ and the transistor's output would be pulled up to $V_{cc}$ once the transistor is forward biased. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4Kb memory arrays to more densely packed array sizes, tolerances of pullup resistances (or pullup loads) had to be tightly current path between a memory cell pulldown transistor and the $V_{ss}$ power supply bus. In this manner the PMOS transistor could be gated on only when the desired line was to be pulled to $V_{cc}$ and turned off otherwise, thereby virtually eliminating leakage current and minimizing standby current for the SRAM device as a whole.

Ongoing efforts to improve active loads has brought about the development of thin film transistors (TFTs) in attempts to provide low leakage current as well as high noise immunity. The following two articles, hereby incorporated by reference, discuss TFT development in SRAMS. The first article is "A POLYSILICON TRANSISTOR TECHNOLOGY FOR LARGE CAPACITY SRAMs," by Ikeda et al., IEDM 1990, pp. 469–472. The second article is "A 25 μm², New Poly-Si PMOS Load (PPL) SRAM Cell Having Excellent Soft Error Immunity," by Yamanaka et al., IEDM 1988, pp. 48–51.

The present invention, however, introduces a TFT that uses a chemical mechanical process (CMP) to form a poly plug used to form the bottom gate thereby leaving the processed wafer substantially flat prior to TFT gate dielectric deposition and for all future photo/etch steps.

SUMMARY OF THE INVENTION

The invention is directed to a process to fabricate a thin film transistor (TFT) using a planarized poly plug as the bottom gate for use in an integrated circuit, such as in an SRAM cell. The TFT is realized by a process for forming planarized TFT fabricated on a starting substrate, with the process comprising:

forming a planarized insulating layer over the starting substrate;

forming a groove in the planarized insulating layer, thereby providing access to an underlying electrically conductive material;

forming a planarized conductive plug inside the groove, the planarized conductive plug forming a gate to the thin film transistor, the conductive plug making contact to the underlying electrically conductive material;

forming a gate dielectric overlying the thin film transistor gate;

forming a patterned overlying semiconductive layer; and doping the patterned semiconductive layer thereby forming a channel region aligning to the thin film transistor gate and a source/drain region aligning to each side of the channel region.

The thin film transistor realized from the process above comprises:

a planarized insulating layer overlying the starting substrate;

a planarized conductive plug residing inside an opening in the planarized insulating layer, the planarized conductive plug forming a gate to the thin film transistor, the conductive plug making contact to an underlying electrically conductive material;

a gate dielectric overlying the thin film transistor gate; and an overlying conductively doped patterned semiconductive layer forming a channel region aligning to the thin film transistor gate and a source/drain region aligning to each side of the channel region.

DETAILED DESCRIPTION OF THE INVENTION

A preferred embodiment of the present invention is directed to a process for fabricating a fully planarized thin film transistor that can be used in a variety of integrated circuits (ICs) and in particular as an active PMOS TFT pullup device in a cross-coupled inverter that can specifically be used as an SRAM cell. FIGS. 1–5 depict various connection orientations of the present invention, while FIGS. 6–9 demonstrate the use of the present invention in an SRAM cell.

Figure 1:
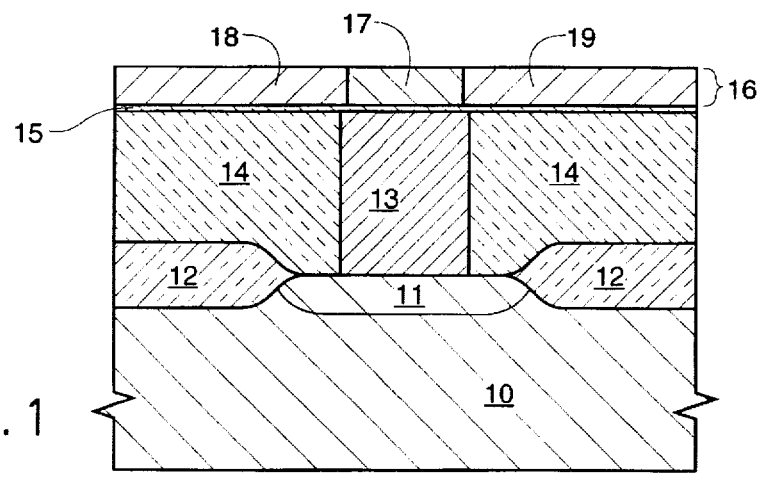
FIG. 1 is a composite cross-sectional view of a wafer portion depicting a planarized TFT with its gate connecting to a diffusion region.

Referring now to a first connection orientation in FIG. 1, a TFT is depicted with this particular construction comprising a silicon substrate 10, having diffusion area 11 (n-type doping) therein, with the diffusion area 11 being isolated by field oxide 12. A polysilicon plug 13 makes contact to diffusion area 11 and serves as the gate terminal for the TFT. Poly plug 13 has been formed in a layer of planarized insulating material 14 that may comprise borophosphosilicate glass (BPSG) or oxide or the like. A thin gate dielectric layer 15 overlies poly plug 13 and a polysilicon layer 16 overlies gate dielectric layer 15 and has been implanted with the proper dopant impurities to form a channel region 17 and source/drain regions 18 and 19.

Figure 2:
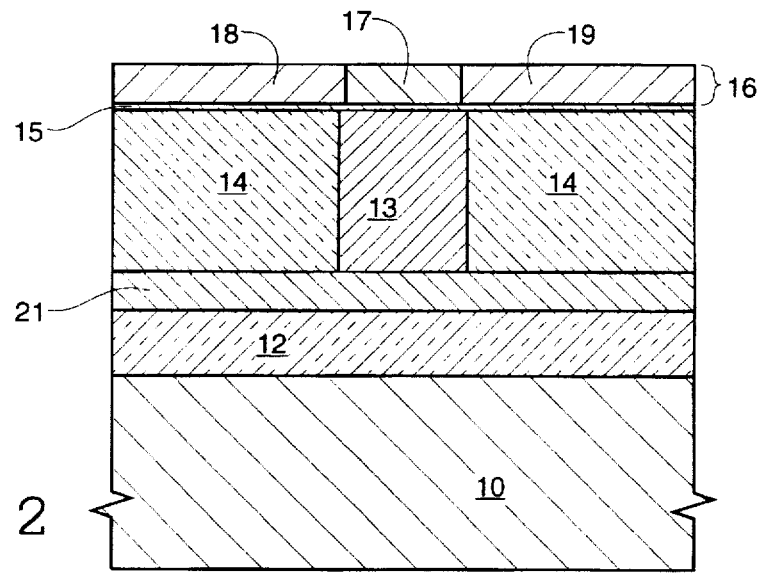
FIG. 2 is a composite cross-sectional view of a wafer portion depicting a planarized TFT with its gate connecting to an underlying electrical conductive material.

Referring now to a second connection orientation in FIG. 2, a TFT is depicted as in FIG. 1 with the exception being that poly plug 13 (or TFT gate) makes contact to an underlying polysilicon layer 21 rather than a diffusion area.

Figure 3:
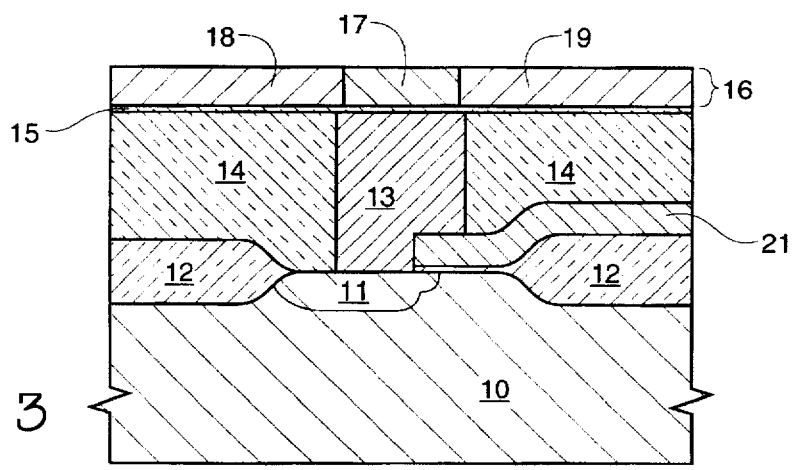
FIG. 3 is a composite cross-sectional view of a wafer portion depicting a planarized TFT with its gate connecting to both a diffusion region and an underlying electrical conductive material.

Referring now to a third connection orientation in FIG. 3, a TFT is depicted as in FIG. 1 with the exception being that poly plug 13 (or TFT gate) makes contact to both an underlying polysilicon layer 21 and a diffusion layer 11.

Figure 4:
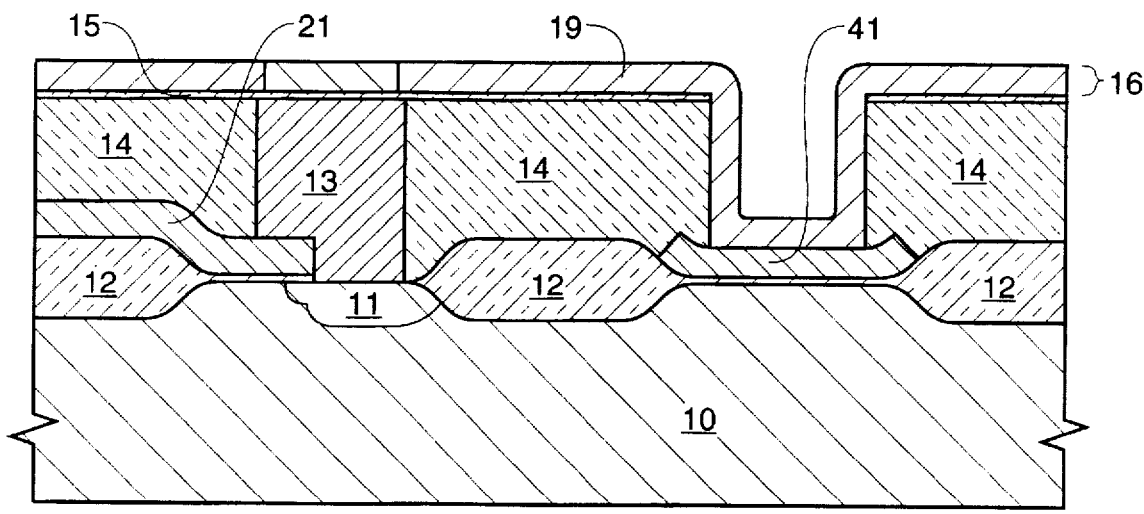
FIG. 4 is a composite cross-sectional view of a wafer portion depicting a planarized TFT with one of its source/drain terminals connecting to an adjacent conductive region via a conformal patterned layer of polysilicon.

Referring now to a fourth connection orientation in FIG. 4, a TFT is depicted as in FIG. 3 in that poly plug 13 (or TFT gate) makes contact to both an underlying polysilicon layer 21 and a diffusion layer 11. This figure further shows the source/drain terminal 19 extending to a neighboring patterned polysilicon layer 41 by way of a second etched groove in planarized insulating layer 14. The source/drain terminal 19 would simply be an extension of poly layer 16 that has been used to form the source/drain terminals of the TFT.

Figure 5:
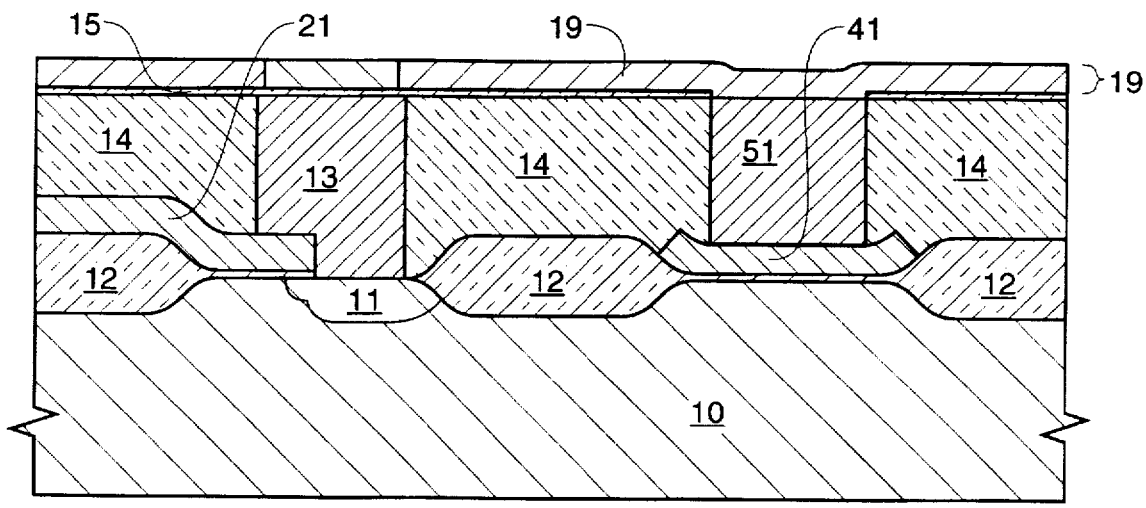
FIG. 5 is a composite cross-sectional view of a wafer portion depicting a planarized TFT with one of its source/drain terminals connecting to an adjacent conductive region via a planarized conductive polysilicon plug.

Referring now to a fifth connection orientation in FIG. 5, a TFT is depicted as in FIG. 4 in that poly plug 13 (or TFT gate) makes contact to both an underlying polysilicon layer 21 and a diffusion layer 11. This figure further shows the source/drain terminal 19 extending to an neighboring polysilicon layer by way of a second etched groove in planarized insulating layer 14. In this case the source/drain terminal 19 would again, simply be an extension of poly layer 16 that has been used to form the source/drain terminals of the TFT, with the exception being that a second poly plug 51 fills the neighboring groove and provides connection between source/drain terminal 19 and poly layer 41.

Figure 6:
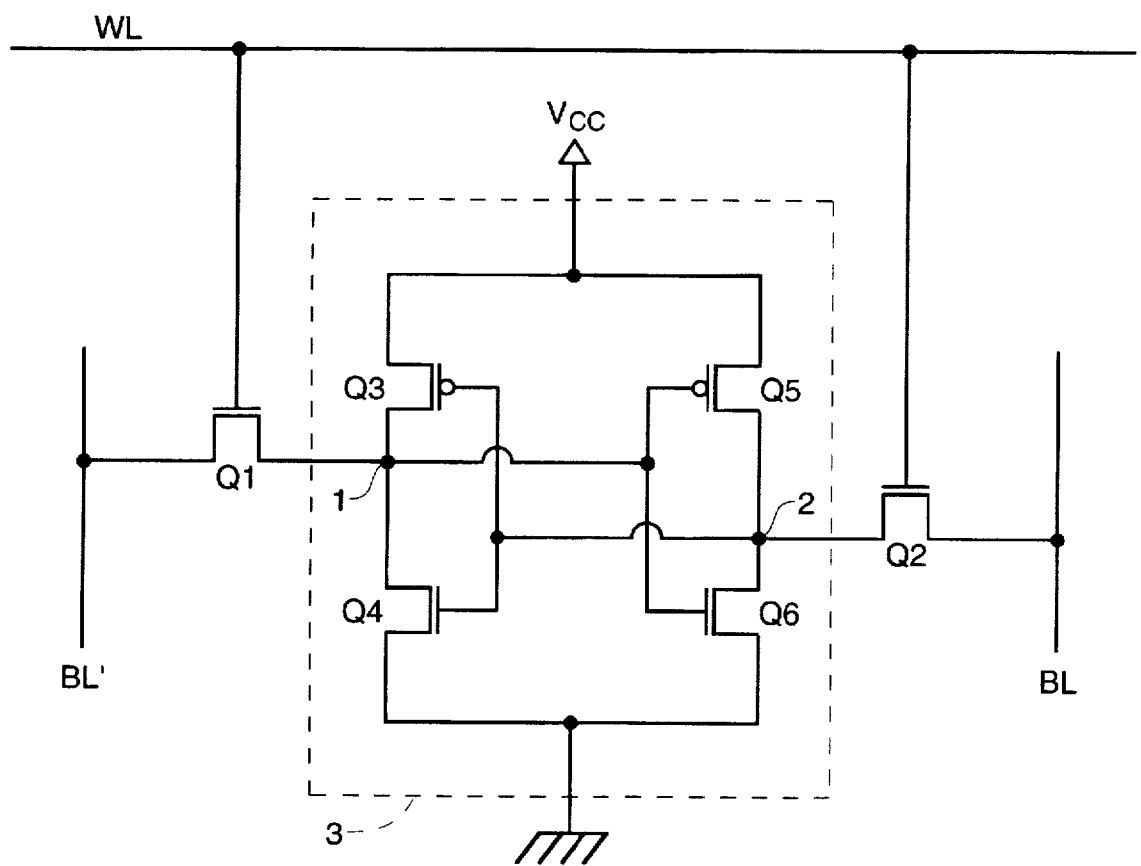
FIG. 6 is a schematical representation of a typical six transistor SRAM cell.
Figure 7:
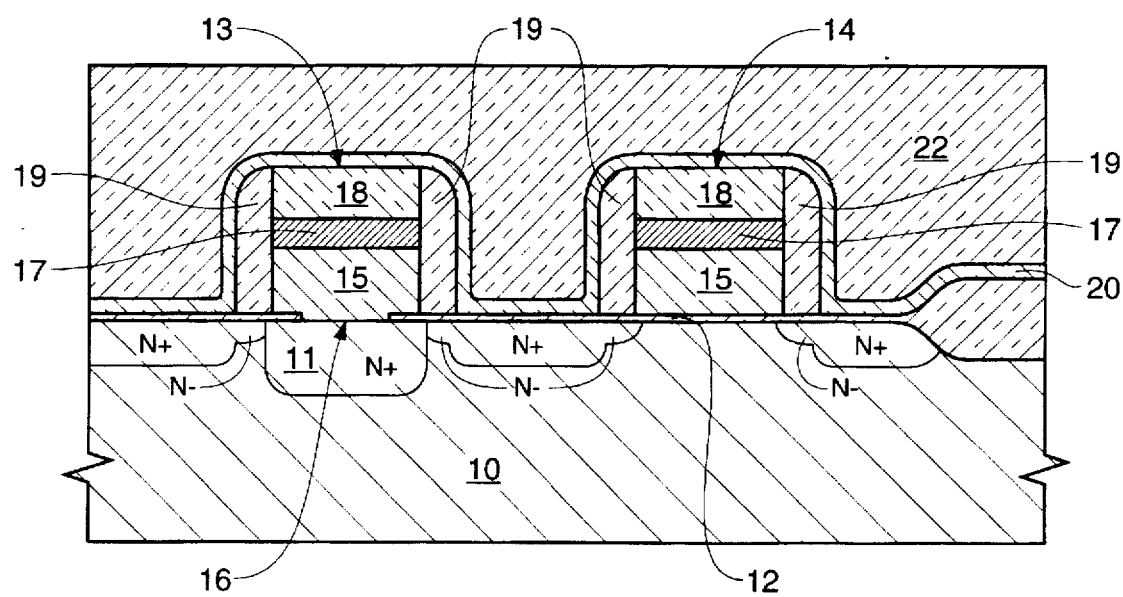
FIG. 7 is a composite cross-sectional view of an in-process wafer portion during fabrication of an SRAM cell.

FIG. 6 depicts the schematical layout of an SRAM cell and is used as a reference to the process steps of the present invention described in FIGS. 7 and 8 and in an alternate embodiment of FIG. 9.

Though the following discussion describes a preferred embodiment of the present invention being used to construct an SRAM storage cell, this discussion is used for illustration purposes as the fabricated planarized TFT can be implemented into any IC process utilizing TFTS.

Referring now to FIG. 6, a six transistor SRAM cell is shown where the wordline (WL) couples to the gates of pass transistors Q1 and Q2. Bitline' (BL') couples to the source/drain region of Q1 and bitline (BL) couples to the source/drain region of Q2. Pass transistors Q1 and Q2 couple to nodes 1 and 2 of cross-coupled inverter 3, respectively. Inverter 3 comprises first and second PMOS pullup devices Q3 and Q5 and first and second NMOS pulldown devices Q4 and Q6.

Several embodiments of the present invention, as depicted in FIGS. 7–9b, are integrated into a conventional SRAM fabrication process to form a CMOS static storage cell using a TFT PMOS device as an active load.

As shown in FIG. 7, a starting silicon substrate 10, having diffusion areas 11 (n-type doping) therein, is fabricated using conventional process steps, known to one skilled in the art. TFT gate coupling line 13 and 14 are formed from a patterned polysilicon layer 15. Coupling line 13 makes contact to substrate 10 at buried contact 16, while coupling line 14 overlies gate -oxide 12 to form a pulldown transistor to the SRAM cell. Coupling lines 13 and 14 (from patterned polysilicon layer 15) are overlaid with a tungsten silicide layer 17 (thus forming a poly/silicide stack, 15 and 17) and a patterned insulating layer 18 of oxide or nitride overlies silicide layer 17. Insulating spacers 19 (nitride, oxide, TaO$_5$ or other suitable insulating materials) cover the patterned edges of coupling lines 13 and 14. Next, a thin insulating layer 20 (oxide is preferred) blankets the existing materials that now reside on the dice. Layer 20 is followed by a thick insulating layer 22 that is planarized, preferably by chemical mechanical polishing.

Figure 8A:
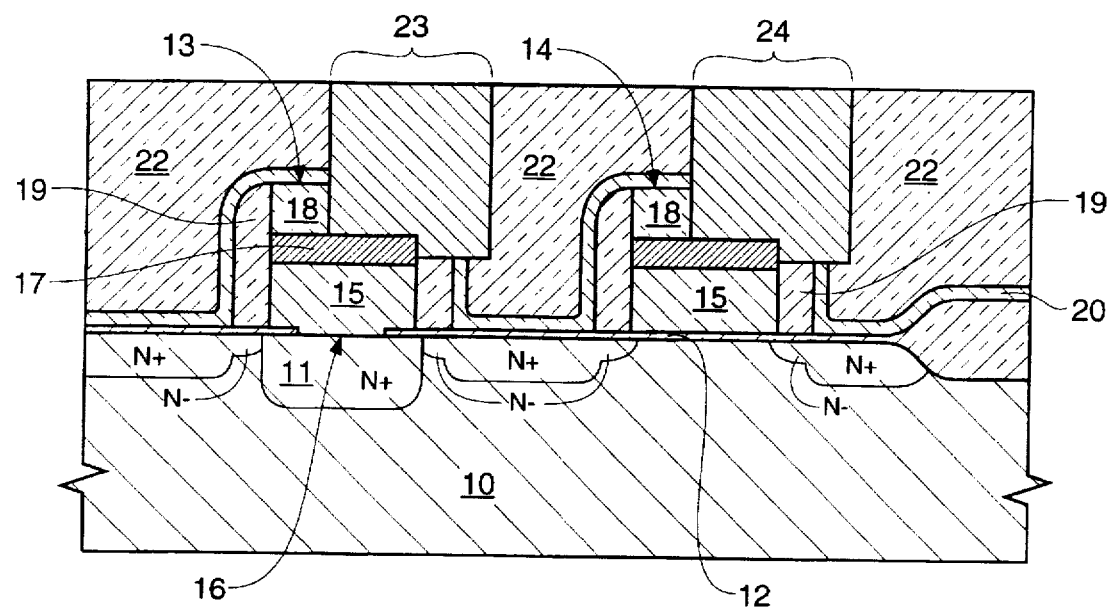
FIGS. 8a and 8b show cross-sectional views of the in-process wafer portion of FIG. 7 after formation and planarization of oxide and deposition of the TFT gate oxide and the TFT gate poly.

Referring now to FIG. 8a, grooves/contact regions 23 and 24 are defined and etched to provide future locations for the TFT poly gates (region 23) and TFT poly drain to coupling line 14 (region 24) connections. In this embodiment, the etch illustrated approximately etches layers 20, 19, 18 and 22 at the same rate to produce the structure shown in FIG. 8a. Contact region 24 connects the future TFT poly drain to the gate of pulldown device of the SRAM cell. The critical aspect is to etch with sufficient overetch to expose silicide layer 17 and yet not etch down to the diffusion area 11 so that the grooves/contacts are not required to be surrounded by polysilicon. Next, an n-type doped polysilicon layer is formed (preferably insitu n-type doped poly) and planarized, using such methods as chemical mechanical polishing (CMP), to isolate the poly filled grooves and form a TFT poly gate 25 and neighboring poly plug interconnect 27 between the gate of a pulldown device and the drain of a future TFT transistor.

Figure 8B:
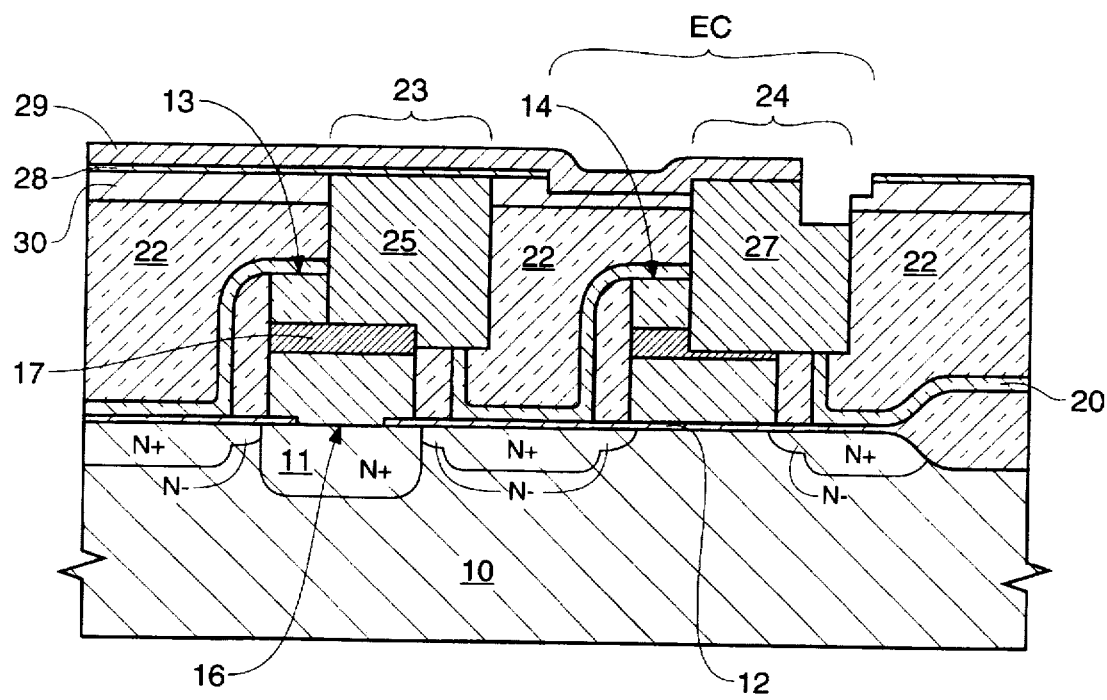

Referring now to FIG. 8b, a TFT gate dielectric 28 is deposited over the planarized TFT poly gate. Next, an exhumed contact (EC) photo and etch is performed to expose neighboring poly plug 27 to allow for a conductive interconnect. The EC need not be overlapped by future TFT poly as the only requirement is that TFT poly make sufficient contact to underlying poly plug interconnect 27. Now the wafer is ready for deposition of TFT polysilicon 29 that overlies TFT dielectric 28 and makes connection to a neighboring poly plug interconnect 27. Following a TFT poly photo and etch, a TFT P+photo and source/drain p+ implant is performed. The wafer is then completed using conventional process steps, including at least one thermal step sufficient to electrically activate the TFT p+ source/drain implants.

Also, as shown in FIG. 8b, an optional insulating layer 30 (preferably nitride) blankets planarized layer 22. Layer 30 is used as a diffusion blocking layer to prevent dopant impurities from diffusing into the future overlying TFT channel.

For example, layer 30 would be needed if planarized insulating layer 22 was BPSG as layer 30 would prevent the dopants of boron and phosphorus, inherent in the BPSG layer, from diffusing into the future overlying TFT channel.

Figure 9A:
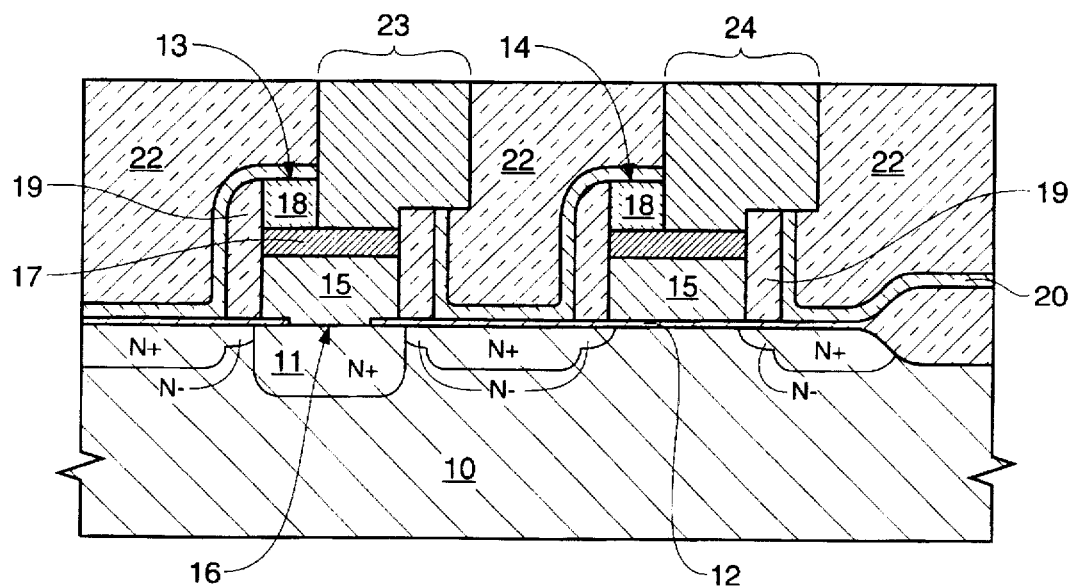
FIGS. 9a and 9b depict a second embodiment of an SRAM cell using the steps of FIG. 7, which show cross-sectional views of a wafer portion that uses extended oxide spacers and nitride above the poly/WSiX stack of the parallel conductive buses.
Figure 9B:
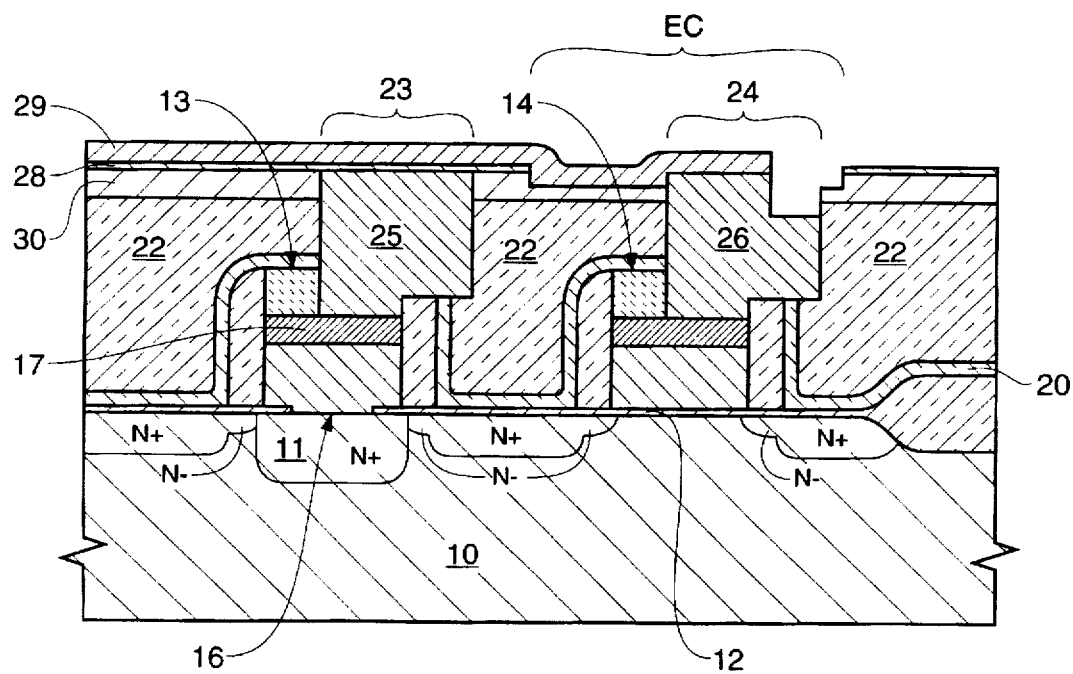

Referring now to an alternate embodiment as depicted in FIGS. 9a and 9b, process steps described in FIGS. 6 and 7 are followed except that insulating spacers 19 are specifically formed from oxide while patterned insulating layer 18 over the patterned tungsten silicide 17 is formed from nitride. This combination allows for the etching of the grooves/contact regions 23 and 24 (described in FIG. 3) to proceed which will sufficiently remove nitride layer 18 and expose underlying tungsten silicide 17 without any danger of etching down to diffusion area 11 (due to the fact that the etch chemistry is chosen such that the nitride will etch at a much higher rate than oxide). The process steps to complete the TFT PMOS device connected to an NMOS pulldown device then continue as described in FIG. 8b.

The embodiment depicted in FIGS. 9a and 9b, can also be altered by simply making the poly/silicide stack, 15 and 17, taller than the stack as described in the previous embodiments. This would allow for the deletion of the overlying nitride 30 as well as allow for the etch to open grooves/contact regions 23 and 24 and expose the tungsten silicide 17 for more overetch and yet still avoid etching down to the diffusion area 11. The process steps then continue as described in FIGS. 9a and 9b.

As one skilled in the art would readily recognize, the conductivity types selected for doping the substrate and forming the active devices may be reversed to create an NMOS TFT device overlying and aligned to an active PMOS device if so desired.

Therefore, it is to be understood that although the present invention has been described with reference to several embodiments, various modifications, known to those skilled in the art, may be made to the structure and process steps presented herein without departing from the invention as recited in the several claims appended hereto.

We claim:

1. A process for forming a transistor assembly on a substrate, comprising the steps of:

providing a substrate having a conductive region formed therein, said substrate having a blanketing insulating layer formed thereon;

patterning and etching said insulating layer using a single patterning and etching step to define an opening extending from a top surface of said insulating layer to said conductive region in said substrate, said opening defined in part by a sidewall in said insulating layer;

forming a conductive silicon material plug within said opening, said plug electrically contacting said conductive region in said substrate and having an upper surface;

forming a dielectric layer overlying said plug upper surface;

forming a semiconductor layer over said dielectric layer and doping said semiconductor layer to form source and drain regions proximate said plug upper surface and said dielectric layer thereon.

2. The method of claim 1, wherein said insulating material layer is planarized.

3. A method for forming a semiconductor device, comprising the steps of:

providing a substrate assembly having first and second conductive regions formed therein;

forming an insulating layer over said first and second conductive regions;

forming a first opening in said insulating layer, said first opening extending to said first conductive region, and forming a second opening in said insulating layer, said second opening extending to said second conductive region, said first and second openings formed by using a single patterning and etching step;

forming a first semiconductor plug in said first opening, said first plug in electrical contact with said first conductive region, and forming a second semiconductor plug in said second opening, said second plug in electrical contact with said second conductive region;

forming a dielectric layer over at least said first plug;

forming a semiconductor layer overlying said dielectric layer proximate said first plug, and doping said semiconductor layer to define source and drain regions within said semiconductor layer.

4. A process for forming a thin film transistor fabricated on a substrate, said process comprising:

a) forming a planarized insulating layer over said starting substrate;

b) forming a groove in said planarized insulating layer and simultaneously providing access to an underlying electrical terminal using a single photo-masking and etching sequence;

c) forming a conductively doped planarized semiconductive plug inside said groove, said conductively doped planarized semiconductive plug forming a gate to said thin film transistor and making contact to said underlying electrical terminal;

d) forming a gate dielectric overlying said thin film transistor gate;

e) forming a patterned overlying semiconductive layer; and j) doping said patterned semiconductive layer thereby forming a channel region aligning to said thin film transistor gate and a source/drain region aligning to each side of said channel region.

5. The process of claim 4, wherein said planarized layer of step "a" is formed by chemical mechanical polishing.

6. The process of claim 4, wherein said planarized layer of step "c" is formed by chemical mechanical polishing.

7. The process of claim 4, wherein said planarized layers of both steps "a" and "c" are formed by chemical mechanical polishing.

8. The process of claim 7, wherein said chemical mechanical polishing comprises a chemical mechanical polishing step that forms said planarized layers of steps "a" and "c" simultaneously.

9. The process of claim 4, wherein said step of forming a planarized insulating layer comprises forming a layer of oxide and planarizing said oxide.

10. The process of claim 4, wherein said step of forming a planarized insulating layer comprises forming a planarized BPSG layer and an overlying nitride layer.

11. The process of claim 4, wherein said step of forming a semiconductive layer comprises the step of forming a layer of conductively doped polysilicon film.

12. A process for forming an inverter fabricated on a substrate, said process comprising:

forming a pulldown transistor, said transistor having a control gate and source/drain terminals;

forming a planarized insulating layer over said pulldown transistor;

defining locations through said insulating layer and in said planarized insulating layer, thereby forming grooves therein, wherein a first groove provides access to a coupling node for a thin film transistor gate and a second groove providing access to said control gate of said pulldown transistor, said grooves are formed by using a single patterning and etching step;

forming a conductively doped planarized plug from a semiconductive material residing inside each said groove, whereby a first conductively doped planarized plug forms said thin film transistor gate connecting to said coupling node and a second conductively doped plug provides connection to said control gate of said pulldown transistor;

forming a gate dielectric overlying said thin film transistor gate;

defining a contact location thereby providing access to said second conductively doped plug;

forming a overlying patterned semiconductive layer; and doping said overlying patterned semiconductive layer thereby forming a channel region aligning to said thin film transistor gate and a source/drain region aligning to each side of said channel region with one source/drain region connecting to said second conductive plug;

wherein said thin film transistor forms an active pullup device connecting to said pulldown transistor.

13. The process of claim 12, wherein said step of forming first and second conductively doped plugs further comprises the steps of:

forming a conductively doped polysilicon layer to completely fill said grooves; and planarizing said conductively doped polysilicon layer thereby separating the polysilicon residing in each said groove from one another to form said first and second conductively doped plugs.

14. The process of claim 13, wherein said step of planarizing said conductively doped polysilicon layer comprises chemical mechanical polishing.

15. The process of claim 12, wherein said step of forming a planarized insulating layer comprises forming a layer of oxide and planarizing said oxide.

16. The process of claim 15, wherein said resultant planarized oxide is formed by chemical mechanical polishing.

17. The process of claim 12, wherein said step of forming a planarized insulating layer comprises forming a planarized BPSG layer.

18. The process of claim 7, wherein an additional undoped insulating layer is formed over said planarized BPSG layer.

19. The process of claim 12, wherein said forming semiconductive layer comprises the step of forming a layer of conductively doped polysilicon film.

20. The process of claim 12, wherein an insitu insulator layer is formed over said semiconductive layer, said insitu insulator layer used to form insulator spacers therefrom.

21. The process of claim 20, wherein said insitu insulator layer comprises nitride.

* * * * *

UNITED STATES PATENT AND TRADEMARK OFFICE
CERTIFICATE OF CORRECTION

PATENT NO. : 5,780,326  
DATED : July 14, 1998  
INVENTOR(S) : Charles H. Dennison, Monte Manning Page 1 of 1

It is certified that error appears in the above-identified patent and that said Letters Patent is hereby corrected as shown below:

Column 1,
After the title please insert:

--GOVERNMENT RIGHTS
This invention was made with Uniet States Govenent support under contrac No. MDA972-92-C0054 awarded by the Advanced Research Projects Agency (ARPA). The United States Government has certain rights in this invention Signed and Sealed this Twenty-fifth Day of September, 2001

*Attest:*

NICHOLAS P. GODICI

*Attesting Officer*  Acting Director of the United States Patent and Trademark Office